United States Patent
Morimoto et al.

(10) Patent No.: US 9,966,297 B2
(45) Date of Patent: May 8, 2018

(54) SEMICONDUCTOR WAFER PROTECTIVE FILM AND METHOD OF MANUFACTURING SEMICONDUCTOR DEVICE

(71) Applicant: MITSUI CHEMICALS TOHCELLO, INC., Chiyoda-ku, Tokyo (JP)

(72) Inventors: Akimitsu Morimoto, Nagoya (JP); Makoto Kataoka, Nagoya (JP); Hideki Fukumoto, Nagoya (JP)

(73) Assignee: MITSUI CHEMICALS TOHCELLO, INC., Chiyoda-Ku, Tokyo (JP)

( * ) Notice: Subject to any disclaimer, the term of this patent is extended or adjusted under 35 U.S.C. 154(b) by 0 days. days.

(21) Appl. No.: 14/894,879

(22) PCT Filed: May 22, 2014

(86) PCT No.: PCT/JP2014/063577
§ 371 (c)(1),
(2) Date: Nov. 30, 2015

(87) PCT Pub. No.: WO2014/192630
PCT Pub. Date: Dec. 4, 2014

(65) Prior Publication Data
US 2016/0133500 A1    May 12, 2016

(30) Foreign Application Priority Data
May 29, 2013    (JP) .................. 2013-113448

(51) Int. Cl.
*H01L 21/30* (2006.01)
*H01L 21/683* (2006.01)
(Continued)

(52) U.S. Cl.
CPC .......... *H01L 21/6836* (2013.01); *B32B 27/06* (2013.01); *B32B 27/08* (2013.01);
(Continued)

(58) Field of Classification Search
CPC ......... B23B 27/06; B23B 27/08; B23B 27/30; C09J 7/0296; H01L 21/6835; H01L 21/6836; H01L 21/02076
(Continued)

(56) References Cited

U.S. PATENT DOCUMENTS 7,358,158 B2 *    4/2008    Aihara ................ C09J 7/021
                                                        257/E21.599
7,514,143 B2    4/2009    Matsumura et al.
(Continued)

FOREIGN PATENT DOCUMENTS

JP    05-032946    2/1993
JP    H05-148462 A    6/1993
(Continued)

OTHER PUBLICATIONS

International Search Report (PCT/ISA/210) dated Aug. 12, 2014, by the Japanese Patent Office as the International Searching Authority for International Application No. PCT/JP2014/063577.
(Continued)

*Primary Examiner* — Kevin M Picardat
(74) *Attorney, Agent, or Firm* — Buchanan, Ingersoll & Rooney PC

(57) ABSTRACT

According to the present invention, there is provided a semiconductor wafer protective film including a substrate layer (A) and an adhesive layer (C) formed on the substrate layer (A), in which the substrate layer (A) includes polymer, and a solubility parameter of the polymer determined by a Van Krevelen method is equal to or greater than 9.

13 Claims, 4 Drawing Sheets

(51) Int. Cl.
- B32B 27/30 (2006.01)
- C09J 7/02 (2006.01)
- B32B 27/06 (2006.01)
- C08F 222/10 (2006.01)
- C09J 133/10 (2006.01)
- B32B 27/08 (2006.01)
- H01L 21/02 (2006.01)
- H01L 21/78 (2006.01)

(52) U.S. Cl.
CPC ........ *B32B 27/30* (2013.01); *C08F 222/1006* (2013.01); *C09J 7/0296* (2013.01); *C09J 133/10* (2013.01); *H01L 21/02057* (2013.01); *H01L 21/78* (2013.01); *B32B 2457/14* (2013.01); *C09J 2201/162* (2013.01); *C09J 2203/326* (2013.01); *C09J 2433/006* (2013.01); *H01L 21/6835* (2013.01); *H01L 2221/6834* (2013.01); *H01L 2221/68327* (2013.01); *H01L 2221/68336* (2013.01); *H01L 2221/68381* (2013.01)

(58) Field of Classification Search
USPC .................. 438/455, 458, 459, 460, 464
See application file for complete search history.

(56) References Cited

U.S. PATENT DOCUMENTS

| | | | | |
|---|---|---|---|---|
| 7,910,206 | B2* | 3/2011 | Kiuchi | B32B 1/08 428/34.9 |
| 8,785,585 | B2 | 7/2014 | Furuya et al. | |
| 2005/0031861 | A1 | 2/2005 | Matsumura et al. | |
| 2007/0128832 | A1 | 6/2007 | Nakamura et al. | |
| 2007/0141330 | A1* | 6/2007 | Morishima | H01L 21/6835 428/343 |
| 2008/0038540 | A1* | 2/2008 | Hirayama | C09J 7/0217 428/323 |
| 2010/0255299 | A1 | 10/2010 | Kawashima et al. | |
| 2010/0330788 | A1* | 12/2010 | Yu | H01L 21/187 438/514 |
| 2011/0224593 | A1* | 9/2011 | Tunius | A61L 15/585 602/54 |
| 2012/0028416 | A1 | 2/2012 | Takamoto et al. | |
| 2012/0058336 | A1* | 3/2012 | Shimokawa | C08F 290/067 428/355 EN |
| 2012/0114938 | A1 | 5/2012 | Ooishi et al. | |
| 2012/0175045 | A1 | 7/2012 | Furuya et al. | |
| 2012/0273975 | A1* | 11/2012 | Hayashishita | H01L 21/67132 257/790 |
| 2013/0133938 | A1 | 5/2013 | Sato et al. | |
| 2013/0220532 | A1* | 8/2013 | Kiuchi | C09J 7/0296 156/247 |
| 2013/0289225 | A1* | 10/2013 | Kondo | H01L 24/26 525/476 |
| 2014/0130969 | A1* | 5/2014 | McCutcheon | B32B 7/06 156/247 |
| 2014/0154450 | A1 | 6/2014 | Yutou et al. | |
| 2014/0154868 | A1* | 6/2014 | Sugo | H01L 21/6835 438/458 |
| 2014/0261978 | A1 | 9/2014 | Furuya et al. | |
| 2014/0322474 | A1* | 10/2014 | Usugi | C07D 319/06 428/41.8 |
| 2015/0348819 | A1* | 12/2015 | Taya | H01L 21/683 428/343 |

FOREIGN PATENT DOCUMENTS

| | | |
|---|---|---|
| JP | 2003-338475 A | 11/2003 |
| JP | 2004-043760 A | 2/2004 |
| JP | 2005-053998 A | 3/2005 |
| JP | 2007-158124 A | 6/2007 |
| JP | 2009-177033 A | 8/2009 |
| JP | 2010-258426 A | 11/2010 |
| JP | 2011-195840 A | 10/2011 |
| JP | 2011-228502 A | 11/2011 |
| JP | 2012-144616 A | 8/2012 |
| JP | 2012-184369 A | 9/2012 |
| JP | 2013-001762 A | 1/2013 |
| JP | 2013-098408 A | 5/2013 |

OTHER PUBLICATIONS

Written Opinion (PCT/ISA/237) dated Aug. 12, 2014, by the Japanese Patent Office as the International Searching Authority for International Application No. PCT/JP2014/063577.

Extended Search Report issued by the European Patent Office in corresponding European Patent Application No. 14805148.5 dated Apr. 5, 2017 (15 pages).

Partial Supplementary Search Report issued by the European Patent Office in corresponding European Patent Application No. 14805148.5 dated Nov. 21, 2016 (9 pages).

* cited by examiner (a)

(b)

SEMICONDUCTOR WAFER PROTECTIVE FILM AND METHOD OF MANUFACTURING SEMICONDUCTOR DEVICE

TECHNICAL FIELD

The present invention relates to a semiconductor wafer protective film and a method of manufacturing a semiconductor device.

BACKGROUND ART

In a method of manufacturing a semiconductor device using a semiconductor wafer, the semiconductor wafer is bound with a support through an adhesive layer on a semiconductor circuit surface, and is ground from the other surface in a state in which the semiconductor circuit surface is protected. Thereafter, a dicing tape is attached to the ground surface of the semiconductor wafer, the support is removed, and dicing is performed.

As a method of protecting a semiconductor circuit surface during grinding, there is a case where a protective tape is used instead of the support, and in particular, in the case of a semiconductor wafer including a step of forming an electrical connecting portion in the vertical direction of the semiconductor wafer, called a through-hole electrode, the semiconductor wafer has a thin thickness and a heating step is included in the steps, and thus, a support which has more favorable heat resistance and supporting properties of the semiconductor wafer is generally used together with an adhesive layer having heat resistance.

Examples of the method of removing such a support include a method of sliding a semiconductor wafer and a support in the direction opposite to the horizontal direction while heating the semiconductor wafer and the support, a method of fixing any one of the semiconductor wafer or the support and of peeling off the other with an angle, and a method of dissolving the adhesive layer with a solvent (refer to Patent Document 1).

Examples of a technique using a method of dissolving the adhesive layer with a solvent are described in Patent Document 2.

Patent Document 2 describes that after being thinned by bonding a support plate in which through holes and grooves are formed in advance to the semiconductor wafer through the adhesive layer, a dicing tape is attached. Through the through holes and grooves of the support plate, a solvent is supplied to dissolve the adhesive layer, and due to this, the semiconductor wafer is peeled from the support plate.

RELATED DOCUMENT

Patent Document

[Patent Document 1] Japanese Patent Publication No. JP-A-2012-144616
[Patent Document 2] Japanese Patent Publication No. JP-A-2007-158124

SUMMARY OF THE INVENTION

However, the technique described in Patent Document 2 is not a technique focused on the resistance of the dicing tape with respect to the solvent used in dissolving the adhesive layer. Therefore, a problem occurs in that characteristics such as adhesion, expansibility, and form followability of the dicing tape are decreased by a solvent.

The present invention has been made in consideration of the above-described circumstances, and relates to a semiconductor wafer protective film having excellent solvent resistance when using a semiconductor wafer having a smooth surface and a method of manufacturing a semiconductor device using the same.

The present inventors focused on the solvent resistance of the semiconductor wafer protective film used in such a step of manufacturing a semiconductor device, in particular, a dicing step, and have conducted intensive examination. As a result, they newly found that the solubility parameter of the polymer included in the substrate layer determined by the Van Krevelen method becomes a good indicator.

That is, the present invention provides a semiconductor wafer protective film including a substrate layer (A) and an adhesive layer (C) formed on the substrate layer (A), in which the substrate layer (A) includes a polymer, and a solubility parameter of the polymer determined by the Van Krevelen method is equal to or greater than 9.

In addition, the present invention provides a method of manufacturing a semiconductor device including a first step of attaching a semiconductor wafer through the adhesive layer (C) of the semiconductor wafer protective film and a second step of washing the semiconductor wafer together with the semiconductor wafer protective film with a solvent.

According to the present invention, there is provided a semiconductor wafer protective film having excellent solvent resistance when using a semiconductor wafer having a smooth surface and a method of manufacturing a semiconductor device using the same.

BRIEF DESCRIPTION OF THE DRAWINGS

The above-described objects, other objects, features, and advantages will be made clearer from the preferred embodiments described below, and the following accompanying drawings.

DESCRIPTION OF EMBODIMENTS

Figure 1:
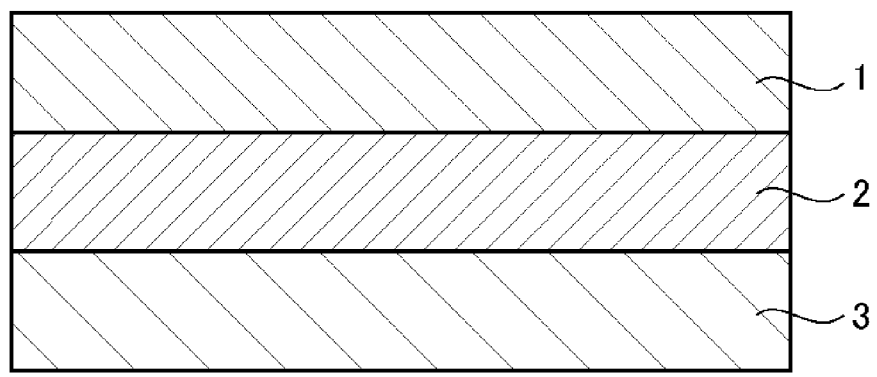
FIG. 1 is a sectional view schematically showing one example of a semiconductor wafer protective film according to an embodiment.

Hereinafter, an embodiment of the present invention will be described with reference to drawings. In all the drawings, like elements are referenced by like reference numerals and descriptions thereof will not be repeated.

(Semiconductor Wafer Protective Film)

As shown in FIG. 1, a semiconductor wafer protective film 10 is formed by laminating a substrate layer 1, an absorbing layer 2, and an adhesive layer 3 in this order.

(Substrate Layer 1)

As the substrate layer 1, a layer formed by molding-processing a synthetic resin into a film shape is used. The substrate layer 1 may be a single layer, or may be a laminate formed of two or more layers. In addition, the substrate layer 1 may be a layer formed by molding-processing a thermoplastic resin, or may be a layer obtained by forming and curing a thermoplastic resin film.

In the substrate layer 1, the solubility parameter (hereinafter, also referred to as "SP value") of the polymer included in the substrate layer determined by the Van Krevelen method is equal to or greater than 9. When the SP value is equal to or greater than 9, the affinity with the solvent (typically, an organic solvent) used in the manufacturing step of a semiconductor device is reduced, and it is possible to prevent deformation, such as expansion or the like due to contact of the solvent with the substrate layer 1, of the substrate layer 1 to some extent. Thereby, it is possible to effectively suppress the solvent to enter between the substrate layer 1 and a layer in contact with the substrate layer 1, specifically, between the substrate layer 1 and the adhesive layer 3 or the substrate layer 1 and the absorbing layer 2. As a result, it is possible to improve the solvent resistance of the semiconductor wafer protective film 10.

The tensile modulus Ea of the substrate layer 1 at 25° C. and at a frequency of 1 Hz is preferably equal to or greater than 0.1 GPa. When the tensile modulus Ea is equal to or greater than a certain level, it is possible to further suppress deformation of the substrate layer 1. By combining these parameters, it is possible to further improve the solvent resistance.

In the semiconductor wafer protective film having expansibility capable of being used in a dicing step or the like, known in the related art, there is no idea of using also in the step in which the solvent resistance is required, as in the present invention, and, for this reason, in the substrate layer, a substance having low solvent resistance, specifically, ethylene-vinyl acetate copolymer (hereinafter, also referred to as EVA), polyethylene, or the like, having a SP value less than 9 is used. In contrast, when the SP value of the polymer included in the substrate layer 1 is equal to or greater than 9, in the semiconductor wafer protective film 10 of the present invention, the entry of a solvent is suppressed, and thus, the solvent resistance may be more favorable.

The tensile modulus Ea of the substrate layer 1 at 25° C. and at a frequency of 1 Hz is preferably equal to or greater than 0.05 GPa, and more preferably equal to or greater than 0.1 GPa. Thereby, it is possible to further maintain the strength of the semiconductor wafer protective film 10. On the other hand, from the viewpoint of improving the form followability of the semiconductor wafer protective film 10 while maintaining the solvent resistance, the tensile modulus Ea is preferably equal to or less than 5 GPa, and more preferably equal to or less than 1 GPa.

The substrate layer 1 is more preferably configured of only a polymer having a SP value of being equal to or greater than 9. Thereby, it is possible to further improve the solvent resistance.

Examples of the raw material polymer used in the substrate layer 1 include a thermoplastic elastomer such as an ethylene-ethyl acrylate copolymer, an ethylene-acrylic acid ester-maleic anhydride copolymer, an ethylene-glycidyl methacrylate copolymer, an ethylene-methacrylic acid copolymer, an ionomer resin, an ethylene-propylene copolymer, a butadiene-based elastomer, and a styrene-isoprene-based elastomer, polyesters such as a polystyrene-based resin, a polyvinyl chloride resin, a polyvinylidene chloride resin, a polyamide-based resin, a polyethylene terephthalate, polybutylene terephthalate, polyethylene naphthalate, polyimide, polyether ether ketone, polycarbonate, polyurethane, an acryl-based resin, a fluorine-based resin, and a cellulose-based resin. Among these, polybutylene terephthalate is more preferable.

The above polymer used in the substrate layer 1 preferably includes an expansibility imparting component as a copolymer component. Thereby, it is possible to obtain excellent expansibility while maintaining the solvent resistance. In addition, by including the expansibility imparting component, a new film in which both solvent resistance and expansibility are achieved, in contrast to the semiconductor wafer protective film having expansibility known in the related art, is obtained.

Examples of the expansibility imparting component include dicarboxylic acids such as isophthalic acid, phthalic acid, 2,6-naphthalene dicarboxylic acid, 5-sodium sulfoisophthalic acid, oxalic acid, succinic acid, adipic acid, sebacic acid, azelaic acid, dodecanedioic acid, dimer acid, maleic anhydride, maleic acid, fumaric acid, itaconic acid, citraconic acid, mesaconic acid, and cyclohexane dicarboxylic acid, and oxycarboxylic acids such as 4-hydroxybenzoic acid, ε-caprolactone, and lactic acid. In addition, the expansibility imparting component preferably includes glycol, and examples thereof include 1,3-propanediol, 1,4-butanediol, neopentyl glycol, 1,6-hexanediol, cyclohexane dimethanol, triethylene glycol, polyethylene glycol, polypropylene glycol, polytetramethylene glycol, and glycols such as an ethylene oxide adduct of bisphenol A or bisphenol S, and from the viewpoint of compatibility with a polymer, polytetramethylene glycol is more preferable. These may be used alone or two or more types thereof may be used in combination.

The melting point of the expansibility imparting component simple substance is preferably equal to or lower than 40° C., and more preferably equal to or lower than 30° C. Thereby, the expansibility imparting component becomes flexible near the temperature at which the semiconductor wafer protective film 10 is extended, and thus, it is possible to obtain excellent expansibility while maintaining the solvent resistance.

When a polymer used in these substrate layers 1 is subjected to molding-processing into a film shape, a stabilizer, a lubricant, an antioxidant, a pigment, an antiblocking agent, a plasticizer, a tackifier, or a softening agent may be added as necessary. In a case where various additives such as a stabilizer are added when the substrate layer 1 is molding-processed, the additives migrate to the adhesive layer 3, and due to this, the characteristics of the adhesive layer 3 are changed, or the semiconductor wafer surface is contaminated. In such a case, a barrier is preferably provided between the substrate layer 1 and the adhesive layer 3 for the purpose of preventing the various additives from migrating to the adhesive layer 3.

The thickness of the substrate layer 1 is preferably 2 μm to 500 μm, and more preferably 5 μm to 500 μm. When the thickness is equal to or greater than the lower limit value, it is possible to maintain the shape of the semiconductor wafer protective film 10. On the other hand, when the thickness is equal to or less than the upper limit value, it is possible to improve the productivity of the semiconductor wafer protective film 10.

The surface of the side on which the adhesive layer 3 of the substrate layer 1 is provided is preferably subjected to a corona discharge treatment or a chemical treatment in advance, in order to improve the adhesive force between the substrate layer 1 and the adhesive layer 3. Alternatively, for the same purpose, an undercoating agent layer may be formed between the substrate layer 1 and the adhesive layer 3. The substrate layer 1 is suitably selected from those manufactured by a known technique such as a calender method, a T-die extrusion method, an inflation method, or a casting method in consideration of productivity, thickness precision of the obtained film, or the like.

(Adhesive Layer 3)

The adhesive layer 3 is a surface in contact with a semiconductor wafer. Thereby, the semiconductor wafer protective film 10 is adhered to the semiconductor wafer, and thus, it is possible to protect the semiconductor wafer surface.

The type of polymer which is the main component of the adhesive layer 3 may be suitably selected from various types of known polymers such as a natural rubber-based polymer, a synthetic rubber-based polymer, a silicone rubber-based polymer, and an acryl-based polymer and used. Among these, in consideration of control of physical properties, reproducibility, or the like, it is preferable that the acryl-based polymer is the main component.

In a case where the polymer which is the main component of the adhesive layer 3 is an acryl-based polymer, as the main monomer configuring the polymer, an acrylic acid alkyl ester, a methacrylic acid alkyl ester, or a mixture thereof is preferable. Examples of the acrylic acid alkyl ester or the methacrylic acid alkyl ester include methyl acrylate, methyl methacrylate, ethyl acrylate, ethyl methacrylate, n-butyl acrylate, n-butyl methacrylate, 2-ethylhexyl acrylate, 2-ethylhexyl methacrylate, and octyl acrylate. These may be used alone or two or more types thereof may be used in combination. The amount used of the main monomer is preferably included within a range of 60% by weight to 99% by weight of the total amount of the entirety of monomers which are raw materials of the polymer. When a monomer mixture having such a composition is used, a polymer including an acrylic acid alkyl ester unit, a methacrylic acid alkyl ester unit, or a mixed unit thereof, having substantially the same composition is obtained.

The polymer which is the main component of the adhesive layer 3 may have a functional group capable of reacting with a crosslinking agent. Examples of the functional group capable of reacting with a crosslinking agent include a hydroxyl group, a carboxyl group, an epoxy group, and an amino group. As a method of introducing the functional group capable of reacting with a crosslinking agent to the adhesive polymer, a method of copolymerizing a comonomer having the functional group when polymerizing a polymer is generally used.

Examples of the comonomer having the above functional group include acrylic acid, methacrylic acid, itaconic acid, mesaconic acid, citraconic acid, fumaric acid, maleic acid, an itaconic acid monoalkyl ester, an mesaconic acid monoalkyl ester, a citraconic acid monoalkyl ester, a fumaric acid monoalkyl ester, a maleic acid monoalkyl ester, 2-hydroxyethyl acrylate, 2-hydroxyethyl methacrylate, acryl amide, methacryl amide, tert-butylaminoethyl acrylate, and tert-butylaminoethyl methacrylate.

One type of these comonomers may be copolymerized with the above-described main monomer, or two or more types thereof may be copolymerized with the above-described main monomer. The amount used (copolymerization amount) of a comonomer having a functional group capable of reacting with the above crosslinking agent is preferably included within a range of 1% by weight to 40% by weight of the total amount of the entirety of monomers which are raw materials of the polymer of the adhesive layer 3. When a monomer mixture having such a composition is used, a polymer including a comonomer unit having substantially the same composition is obtained.

In the embodiment, in addition to the main monomer configuring the polymer which is the main component of the adhesive layer 3 and the comonomer having a functional group capable of reacting with a crosslinking agent, a specific comonomer (hereinafter, also referred to as "polymerizable surfactant") having properties as a surfactant may be copolymerized. The polymerizable surfactant has properties of copolymerizing the main monomer and the comonomer, and acts as an emulsifier in a case where emulsion polymerization is performed. In a case where a polymer obtained by emulsion polymerization using a polymerizable surfactant is used, typically, contamination of a semiconductor wafer surface by a surfactant does not occur. In addition, even in a case where slight contamination due to the adhesive layer 3 occurs, it is possible to easily remove the contamination by washing the semiconductor wafer surface with water.

Examples of such a polymerizable surfactant include a surfactant in which a polymerizable 1-propenyl group is introduced to a benzene ring of polyoxyethylene nonylphenyl ether [manufactured by Dai-ichi Kogyo Seiyaku Co., Ltd.; trade name: Aqualon RN-10, Aqualon RN-20, Aqualon RN-30, and Aqualon RN-50], a surfactant in which a polymerizable 1-propenyl group is introduced to a benzene ring of an ammonium salt of a sulfuric acid ester of polyoxyethylene nonylphenyl ether [manufactured by Dai-ichi Kogyo Seiyaku Co., Ltd.; trade name: Aqualon HS-10 and Aqualon HS-20], and a sulfosuccinate diester-based surfactant having a polymerizable double bond in the molecule [manufactured by Kao Corporation; trade name: Latemul S-120A and Latemul S-180A].

Furthermore, as necessary, monomers having a self crosslinkable functional group such as glycidyl acrylate, glycidyl methacrylate, isocyanate ethyl acrylate, isocyanate ethyl methacrylate, 2-(1-aziridinyl)ethyl acrylate, and 2-(1-aziridinyl)ethyl methacrylate, monomers having a polymerizable double bond such as vinyl acetate, acrylonitrile, and styrene, or polyfunctional monomers such as divinyl benzene, vinyl acrylate, vinyl methacrylate, allyl acrylate, and allyl methacrylate may be copolymerized.

Examples of the polymerization reaction mechanism of the polymer which is the main component of the adhesive layer 3 include radical polymerization, anionic polymerization, and cationic polymerization. In consideration of the manufacturing cost of the polymer, the effect of the functional group of the monomer and the ion effect on a semiconductor wafer surface, the polymer is preferably polymerized by the radical polymerization. Examples of a radical polymerization initiator when the polymer is polymerized by a radical polymerization reaction include organic peroxides such as benzoyl peroxide, acetyl peroxide, isobutyryl peroxide, octanoyl peroxide, di-tert-butyl peroxide, and di-tert-amyl peroxide, inorganic peroxides such as ammonium persulfate, potassium persulfate, and sodium persulfate, and azo compounds such as 2,2'-azobisisobutyronitrile, 2,2'-azobis-2-methyl butyronitrile, and 4,4'-azobis-4-cyanovaleric acid.

In a case where the polymer which is the main component of the adhesive layer 3 is polymerized by the radical polymerization reaction, a chain transfer agent may be added for the purpose of adjusting the molecular weight of the polymer, as necessary. Examples of the chain transfer agent may include chain transfer agents generally used in the related art, for example, mercaptans such as tert-dodecyl mercaptan and n-dodecyl mercaptan. The amount used of the chain transfer agent is about 0.001 parts by weight to about 0.5 parts by weight with respect to the total amount of 100 parts by weight of the monomer.

The polymerization method of the polymer which is the main component of the adhesive layer 3 may be suitably selected from known polymerization methods such as an emulsion polymerization method, a suspension polymerization method, and a solution polymerization method, and used. In particular, regarding the polymer configuring the adhesive layer 3, considering that the adhesive layer 3 is in direct contact with the semiconductor wafer surface, the emulsion polymerization method in which a polymer having a high molecular weight is obtained is preferably adopted from the viewpoint of contamination prevention with respect to the wafer.

In a case where the polymer which is the main component of the adhesive layer 3 is polymerized by the emulsion polymerization method, among these radical polymerization initiators, water-soluble inorganic peroxide such as ammonium persulfate, potassium persulfate, or sodium persulfate, or water-soluble azo compounds having a carboxyl group in the molecule such as 4,4'-azobis-4-cyanovaleric acid is preferable. In consideration of the ion effect on a semiconductor wafer surface, ammonium persulfate or an azo compound having a carboxyl group in the molecule such as 4,4'-azobis-4-cyanovaleric acid is more preferable. An azo compound having a carboxyl group in the molecule such as 4,4'-azobis-4-cyanovaleric acid is particularly preferable.

A crosslinking agent having two or more crosslinking reactive functional groups in a molecule may be added to the polymer forming the adhesive layer 3. When a crosslinking agent having two or more crosslinking reactive functional groups in a molecule is added, it is possible to adjust the crosslinking density, adhesive force, and cohesive force by reacting the crosslinking reactive functional group of the crosslinking agent with the functional group of the polymer.

Examples of the crosslinking agent include epoxy-based crosslinking agents such as sorbitol polyglycidyl ether, polyglycerol polyglycidyl ether, pentaerythritol polyglycidyl ether, diglycerol polyglycidyl ether, glycerol polyglycidyl ether, neopentylglycol diglycidyl ether, and resorcin diglycidyl ether, aziridine-based crosslinking agents such as trimethylolpropane-tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis (1-aziridinecarboxyamide), N,N'-toluene-2,4-bis(1-aziridinecarboxyamide), and trimethylolpropane-tri-β-(2-methylaziridine) propionate, and isocyanate crosslinking agents such as tetramethylene diisocyanate, hexamethylene diisocyanate, toluene diisocyanate 3 adduct of trimethylolpropane, and polyisocyanate. These crosslinking agents may be used alone or two or more types thereof may be used in combination.

In a case where the polymer which is the main component of the adhesive layer 3 is an aqueous polymer such as an aqueous solution or an emulsion having water as a medium, the deactivation rate of an isocyanate-based crosslinking agent due to side reactions with water is fast, and thus, a crosslinking reaction with the polymer does not sufficiently proceed in some cases. Therefore, in this case, an aziridine-based crosslinking agent or an epoxy-based crosslinking agent among the above crosslinking agents is preferably used.

The content of the crosslinking agent having two or more crosslinking reactive functional groups in a molecule in the embodiment is preferably 0.01 parts by weight to 30 parts by weight, and more preferably 0.1 parts by weight to 25 parts by weight, with respect to 100 parts by weight of the polymer which is the main component of the adhesive layer 3. When the content of the crosslinking agent is equal to or greater than the lower limit value, the cohesive force of the adhesive layer 3 becomes sufficient, and an occurrence of contamination of a semiconductor wafer surface may be suppressed. On the other hand, when the content of the crosslinking agent is equal to or less than the upper limit value, high adhesion between the adhesive layer 3 and the semiconductor wafer surface is maintained, and damage of the semiconductor wafer due to infiltration of water or grinding dust during a grinding process or an occurrence of contamination of the semiconductor wafer surface by grinding dust may be suppressed.

In order to adjust the adhesion characteristics, in the polymer configuring the adhesive layer 3, a tackifier such as a rosin-based resin, a terpene-based resin, or the like, in addition to the crosslinking agent having two or more crosslinking reactive functional groups in a molecule, may be suitably contained. In a case where the polymer is an emulsion liquid, a film-forming assistant such as diethyleneglycol monobutyl ether may be suitably contained within the scope of the purpose of the present invention.

The adhesive layer 3 may include a crosslinked polymer formed by crosslinking by energy ray irradiation using an adhesive polymer and a crosslinking agent which reacts by energy rays. In this case, the adhesive polymer has a functional group capable of reacting with a crosslinking agent by radical polymerization by energy ray irradiation. Examples of the functional group include a group having a carbon-carbon double bond (radical polymerizable double bond) such as an acrylic group, a methacrylic group, an allyl group, or a styryl group. The functional group preferably has a carbon-carbon double bond (radical polymerizable double bond) from the viewpoint of the fact that the bonding strength when crosslinked with a crosslinking agent is high, a decomposition reaction is less likely to occur, and degradation over time of the characteristics may be effectively suppressed.

As the method of introducing the functional group into the adhesive polymer (acryl-based resin), a method of copolymerizing a comonomer having a functional group when polymerizing a polymer, or a method of polymerizing an adhesive polymer having a functional group such as a hydroxyl group or a glycidyl group and by introducing by reacting a monomer having a carbon-carbon double bond such as methacrylic acid or acrylic acid with the functional group is generally used. The amount used (copolymerization amount) of a comonomer having a functional group capable of reacting with a crosslinking agent is preferably included within a range of 1% by weight to 40% by weight in the total amount of the entire monomers which are raw materials of an adhesive polymer. When a monomer mixture having such a composition is used, a polymer including a comonomer unit having substantially the same composition is obtained.

From the viewpoint of achieving both solvent resistance and form followability, the gel fraction of the adhesive layer 3 is preferably equal to or greater than 30% by weight, and more preferably equal to or greater than 40% by weight. On the other hand, from the viewpoint of handling properties, the gel fraction is preferably equal to or less than 90% by weight, and more preferably equal to or less than 80% by weight.

In addition, as the adhesive layer 3, an acryl-based polymer having a gel fraction of equal to or greater than 30% by weight and equal to or less than 90% by weight is more preferably used.

The gel fraction may be determined as follows. About 1 g (W1) of an adhesive layer is immersed in 100 g of a mixed solution (1:1) of toluene and ethyl acetate at 25° C. for 168 hours, filtration is performed, the filtrate is dried, the weight (W2) is determined, and the gel fraction is calculated by the following formula (1).

$$\{(W1/W2)/W1\} \times 100\% \quad (1)$$

The storage modulus Gc of the adhesive layer 3 at 25° C. and at a frequency of 1 Hz is preferably equal to or greater than 0.01 MPa, and more preferably equal to or greater than 0.1 MPa. Thereby, the excellent strength of the film is obtained while maintaining the solvent resistance. On the other hand, the storage modulus Gc at 25° C. and at a frequency of 1 Hz is preferably equal to or less than 10 MPa, and more preferably equal to or less than 1 MPa. Thereby, the form followability of the film may be improved while maintaining the solvent resistance.

(Absorbing Layer 2)

The absorbing layer 2 is a layer having an uneven absorbency of a semiconductor wafer surface. As described below, for example, the absorbing layer 2 may be provided between the substrate layer 1 and the adhesive layer 3, or may be a layer also having the function of the adhesive layer 3. The absorbing layer 2 may be a single layer, or a layer obtained by laminating two or more layers. Another layer may be provided between the substrate layer 1 and the absorbing layer 2, or between the absorbing layer 2 and the adhesive layer 3. From the viewpoint of the uneven absorbency, a layer provided between the absorbing layer 2 and the adhesive layer 3 is preferably a layer formed of a material having high flexibility or a thin layer, and it is preferable that the absorbing layer 2 and the adhesive layer 3 are at least partially in contact with each other. Furthermore, for another layer capable of being provided between the substrate layer 1 and the absorbing layer 2, or between the absorbing layer 2 and the adhesive layer 3, from the viewpoint of solvent resistance, the SP value of the layer, like the substrate layer 1, is also preferably equal to or greater than 9.

The substrate layer 1 and the absorbing layer 2 may be in contact with each other at least partially. Thereby, the form followability may be further improved. In more detail, in a case where there is unevenness on a semiconductor wafer surface which is protected by the semiconductor wafer protective film 10, a solvent is likely to enter between the unevenness and the semiconductor wafer protective film 10 compared to a case where unevenness is not present or small, and thus, the semiconductor wafer protective film 10 is likely to be peeled off from the semiconductor wafer. Therefore, in the related art, there is no idea of using a semiconductor surface protective film in a case where there is unevenness on the surface of a semiconductor wafer also in a step of using a solvent, and there is no idea of improving the solvent resistance of the substrate layer of the semiconductor surface protecting film. In contrast, in the semiconductor wafer protective film 10 of the present invention, the absorbing layer 2 absorbing the unevenness on a semiconductor wafer surface is disposed between the adhesive layer 3 and the substrate layer 1. Thereby, even in the case of using a semiconductor wafer having unevenness on the surface, excellent solvent resistance is obtained.

The unevenness of a semiconductor wafer surface means that bump electrodes having a height of 10 µm to 200 µm or protruding objects such as defective circuit identification marks are formed on the surface of a semiconductor wafer with a pitch of 50 µm to 1000 µm. In other words, a semiconductor wafer having a smooth surface refers to a semiconductor in which these bump electrodes or protruding objects are not formed on the surface. The difference in level of a semiconductor wafer surface refers to the maximum value of the height of the region where these bump electrodes or protruding objects are formed from the surface of the region of a semiconductor wafer where these bump electrodes or protruding objects are not formed.

As the polymer configuring the absorbing layer 2, the same polymer as that of the adhesive layer 3 as described above may be used, and the polymer configuring the absorbing layer 2 may be the same as or different from that of the adhesive layer 3. As the polymer configuring the absorbing layer 2, an acryl-based polymer is more preferable from the viewpoint of improving the form followability of a film while maintaining the solvent resistance.

From the viewpoint of achieving both solvent resistance and form followability, the gel fraction of the absorbing layer 2 is preferably equal to or greater than 30% by weight, and more preferably equal to or greater than 40% by weight. On the other hand, from the viewpoint of handling properties, the gel fraction is preferably equal to or less than 90% by weight, and more preferably equal to or less than 80% by weight.

In addition, as the absorbing layer 2, an acryl-based polymer having a gel fraction of equal to or greater than 30% by weight and equal to or less than 90% by weight is more preferably used.

The gel fraction of the absorbing layer 2 may be adjusted in the same manner as in the adhesive layer 3.

The storage modulus Gb of the absorbing layer 2 at 25° C. and at a frequency of 1 Hz is preferably equal to or greater than 0.01 MPa, and more preferably equal to or greater than 0.05 MPa. Thereby, the excellent strength of the film is obtained while maintaining the solvent resistance. On the other hand, the storage modulus Gb at 25° C. and at a frequency of 1 Hz is preferably equal to or less than 1 MPa, and more preferably equal to or less than 0.5 MPa. Thereby, the form followability of the film may be improved while maintaining the solvent resistance.

The storage modulus Gb of the absorbing layer 2 at 25° C. affects adhesion with respect to the surface of a semiconductor wafer. When the storage modulus is high, the absorbing layer 2 becomes hard, and due to this, the adhesion is reduced. For example, in the case of using a semiconductor wafer in which bump electrodes having a height of 10 µm to 200 µm or protruding objects such as defective circuit identification marks are formed on the circuit formed surface of the semiconductor wafer with a pitch of 50 µm to 1000 µm, the tendency is particularly significant. In contrast, when the storage modulus is too low, the adhesion is improved, however, the shape as the absorbing layer 2 is less likely to be maintained due to increase of fluidity, and the handling properties at the time of attaching and peeling are deteriorated. From the above viewpoint, at least one layer (absorbing layer (X)) in the absorbing layer 2 preferably has a storage modulus of equal to or greater than 0.001 MPa and less than 0.07 MPa, at 25° C. The absorbing layer (X) having the characteristics may be a single layer, or may be formed of two or more layers.

In a case where improvement of the handling properties, the adhesive force between respective layers of the absorbing layer 2, or the adhesive force between the absorbing layer 2 and the substrate layer 1 is desired, the absorbing layer 2 having a storage modulus which is out of the above range at 25° C. may be formed within a range in which the object of the present invention is not impaired. In this case, in consideration of the adhesion with respect to the wafer surface, the total thickness of the absorbing layer 2 having the storage modulus which is out of the above range is preferably equal to or less than 25% of the total thickness (tx) of the absorbing layer (X) having the storage modulus.

The semiconductor wafer protective film 10 of the present invention may be suitably used for protecting the surface of a semiconductor wafer having protruding objects such as bump electrodes having a height of 10 μm to 200 μm, defective circuit identification marks, or mixtures thereof. In this case, the total thickness (tx, unit: μm) of the absorbing layer (X) having the storage modulus and the height (ha, unit: μm) of the protruding object (A) preferably satisfy the relationship of the following expression (2).

$$tx \leq ha \tag{2}$$

The thickness of the absorbing layer 2 is suitably selected within typically a range of 3 μm to 300 μm, and more preferably within a range of 5 μm to 250 μm. When the thickness is equal to or less than the upper limit value, it is possible to suppress manufacture of the semiconductor wafer protective film 10 to become difficult, and the productivity is improved. On the other hand, when the thickness is equal to or greater than the lower limit value, the adhesion with respect to the wafer surface is improved. In consideration of the above points, the thickness of the absorbing layer 2 is preferably equal to or greater than 10 μm and equal to or less than 400 μm, and more preferably 10 μm to 300 μm. In addition, the total thickness of the adhesive layer 3 and the absorbing layer 2 is preferably 11 μm to 550 μm.

(Storage Modulus)

Next, a controlling method of the storage modulus Gc of the adhesive layer 3 and the storage modulus Gb of the absorbing layer 2 will be described. The storage modulus depends on factors such as (a) the type and the amount used of the main monomer configuring the polymer, (b) the type and the amount used (copolymerization amount) of the comonomer having a functional group capable of reacting with a crosslinking agent, (c) the polymerization method of the polymer, and (d) the added amount of the crosslinking agent. The effects of these factors on the storage modulus will be described.

First, regarding (a) the type and the amount used of the main monomer configuring the polymer, in the case of using an acrylic acid alkyl ester or a methacrylic acid alkyl ester as a main monomer, when selecting an acrylic acid alkyl ester such as methyl acrylate, ethyl acrylate, or n-butyl acrylate, in which the alkyl group has four or less carbon atoms, or a methacrylic acid alkyl ester such as methyl methacrylate, ethyl methacrylate, n-butyl methacrylate, or 2-ethylhexyl methacrylate, there is a tendency that the storage modulus is increased. On the other hand, when selecting an acrylic acid alkyl ester such as 2-ethylhexyl acrylate or octyl acrylate, in which the alkyl group has 5 to 8 carbon atoms, there is a tendency that the storage modulus is decreased. In either case, as the amount used of these main monomers is increased, the value of the storage modulus is greatly affected. Accordingly, typically, in the case of forming the adhesive layer 3, an acrylic acid alkyl ester in which the alkyl group has four or less carbon atoms or a methacrylic acid alkyl ester is mainly preferably used. In addition, in the case of forming the absorbing layer 2, an acrylic acid alkyl ester in which the alkyl group has 5 to 8 carbon atoms is mainly preferably used.

Regarding (b) the type and the amount used (copolymerization amount) of the comonomer having a functional group capable of reacting with a crosslinking agent, in the case of using, for example, a comonomer having a carboxyl group such as acrylic acid, methacrylic acid, or itaconic acid, a comonomer having an amide group such as acryl amide, methacryl amide, or N-methylolacryl amide, or methacrylic acid ester such as glycidyl methacrylate or 2-hydroxyethyl methacrylate, among comonomers commonly used as a comonomer, in general, there is a tendency that the storage modulus is high, and as the amount used (copolymerization amount) is increased, the tendency is increased. Accordingly, typically, it is preferable that, in the case of forming the adhesive layer 3, the added amount of a comonomer in which the storage modulus described above tends to be increased is relatively large within the above range, and in the case of forming the absorbing layer 2, the added amount of the comonomer is relatively small within the above range.

Regarding (c) the polymerization method of a polymer, in the case of using a polymerization method in which a polymer having a high molecular weight is obtained, such as, in particular, an emulsion polymerization or a method in which polymerization is performed at a high monomer concentration, the storage modulus becomes high and the tendency of decrease in the storage modulus due to the temperature is reduced, and there is a tendency that the storage modulus ratio is decreased, compared to the case of adopting other polymerization methods. On the other hand, in the case of using a polymerization method in which a polymer having a high molecular weight is less likely to be obtained, such as a method in which polymerization is performed by adding a chain transfer agent or a method in which liquid polymerization is performed in a system in which a solvent such as toluene having a chain transfer agent effect is comparatively largely present, there is a tendency that the storage modulus is reduced, and there is a tendency that the storage modulus ratio is increased, compared to the case of adopting other polymerization method. Accordingly, typically, in the case of forming the adhesive layer 3, the above-described polymerization method in which a polymer having a high molecular weight is obtained is preferably adopted. In the case of forming the absorbing layer 2, the above-described polymerization method in which a polymer having a high molecular weight is less likely to be obtained is preferably adopted.

Regarding (d) the added amount of the crosslinking agent, there is tendency that, when the added amount of the crosslinking agent is increased, the storage modulus is increased, and the storage modulus ratio is decreased, and in contrast, when the added amount of the crosslinking agent is decreased, the storage modulus is decreased, and the storage modulus ratio is increased. However, when the amount added of the crosslinking agent is greater than a certain amount corresponding to the type and the amount used (copolymerization amount) of a comonomer having a functional group capable of reacting with the crosslinking agent described above, that is, the crosslinking agent is added more than necessary, by the influence of the crosslinking agent remaining in an unreacted state, the storage modulus is decreased, and the storage modulus ratio is increased, in some case. Accordingly, typically, it is preferable that, in the case of forming the adhesive layer 3, the amount used of the crosslinking agent is relatively large within the above range, and in the case of forming the absorbing layer 2, the amount used of the crosslinking agent is relatively small within the above range.

In the above embodiment, an example in which the semiconductor wafer protective film 10 has the absorbing layer 2 has been described, however, the semiconductor wafer protective film 10 may have at least the substrate layer 1 and the adhesive layer 3, and the embodiment is not limited to the example in which the semiconductor wafer protective film 10 has the absorbing layer 2.

(Method for Manufacturing Semiconductor Wafer Protective Film 10)

The method of manufacturing the semiconductor wafer protective film 10 is not particularly limited, and, for example, the semiconductor wafer protective film 10 may be manufactured as follows.

First, a method of forming the absorbing layer 2 and the adhesive layer 3 on one surface of the substrate layer 1 in order is exemplified. Specifically, a method in which a solution or an emulsion liquid (hereinafter, these are collectively referred to as a coating liquid) of the above polymer which is a raw material of the absorbing layer 2 or the adhesive layer 3 is sequentially applied to the substrate layer 1 and dried according to a method known in the related art such as a roll coater, a comma coater, a die coater, a mayer bar coater, a reverse roll coater, or gravure coater, to form layers, may be used. At this time, in order to protect the coated absorbing layer 2 or the coated adhesive layer 3 from contamination due to the environment, a release film is preferably attached to the surface of the coated layer.

As another method, a method in which the coating liquid is applied to one surface of the release film and dried according to a know method to form the adhesive layer 3 and the absorbing layer 2, and the layers are transferred to the substrate layer 1 using a method used in the related art such as a dry lamination method (hereinafter, referred to as a transfer method) is exemplified. When a plurality of layers are laminated by the transfer method, after layers are formed by applying layer by layer on one surface of the release film and by drying, a step of sequentially transferring to one surface of the substrate layer 1 may be repeated a plurality of times, or after the adhesive layer 3 and the absorbing layer 2 are sequentially formed on one surface of the release film in advance, these layers may be transferred to one surface of the substrate layer 1 at one time.

The drying conditions when drying the coating liquid is not particularly limited, and, in general, the drying is preferably performed within a temperature range of 80° C. to 300° C. for 10 seconds to 10 minutes. The drying is more preferably performed within a temperature range of 80° C. to 200° C. for 15 seconds to 8 minutes. In the present invention, in order to sufficiently promote the crosslinking reaction between the crosslinking agent and the polymer, and in order to achieve sufficient adhesion between the respective layers of the laminated adhesive layer 3 and absorbing layer 2, after the drying of the coating liquid ends, the semiconductor wafer protective film 10 may be heated at 40° C. to 80° C. for about 5 hours to 300 hours.

(Method for Manufacturing Semiconductor Device)

The method of manufacturing a semiconductor device of the embodiment includes the following steps.

Figure 2:
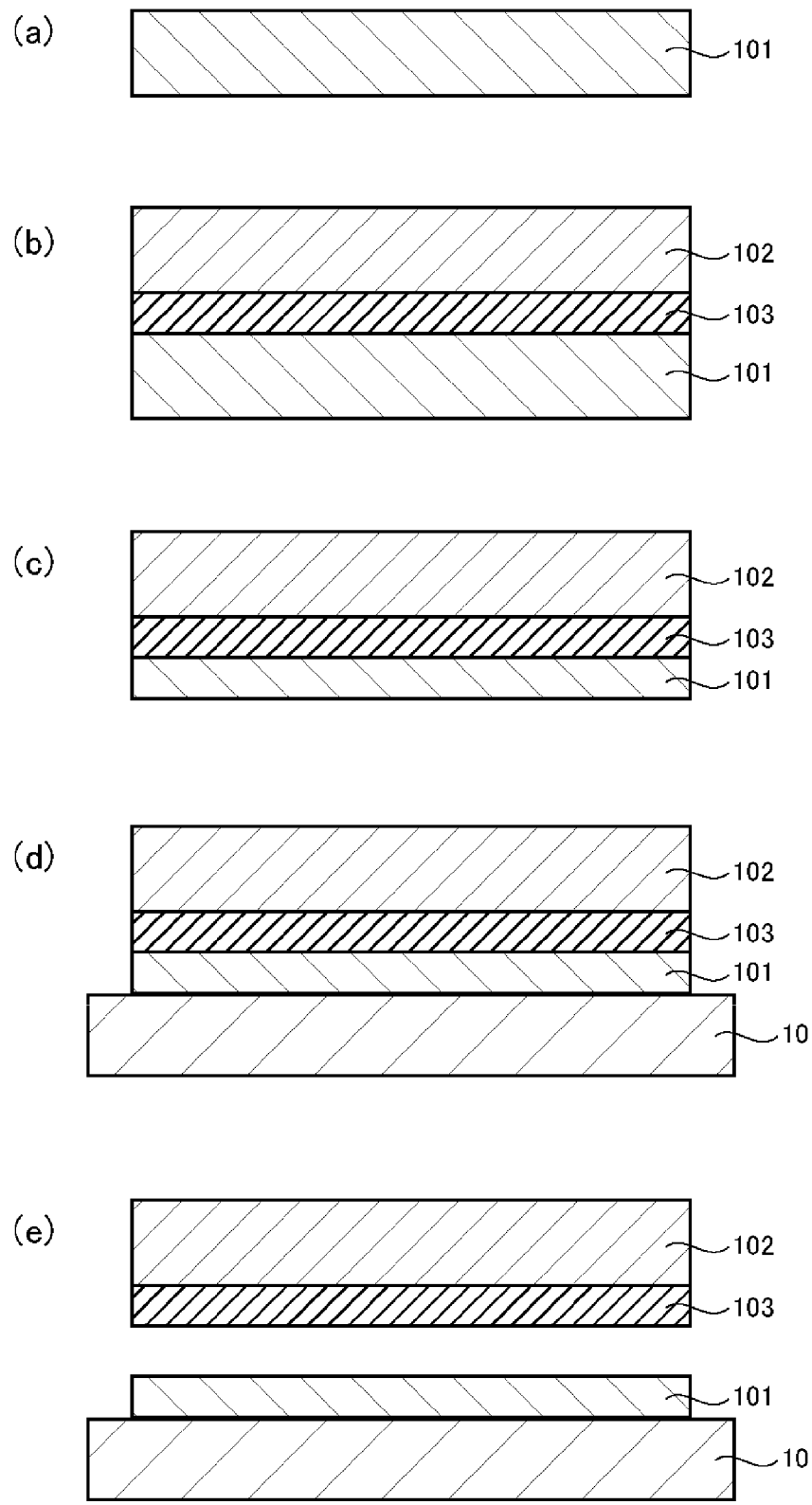
FIG. 2 is a process sectional view schematically showing one example of a semiconductor device according to the embodiment.

As shown in FIG. 2(a), a semiconductor wafer 101 is prepared, and as shown in FIG. 2(b), an adhesive layer 103-applied support substrate 102 is attached to the side opposite to the principal surface of the semiconductor wafer 101.

Next, as shown in FIG. 2(c), the principal surface of the semiconductor wafer 101 is ground to make the semiconductor wafer 101 thin.

A difference in level of 5 µm to 200 µm may be provided on the principal surface of the semiconductor wafer.

Whereas the thickness of the conductor wafer before being ground the thickness is typically 500 µm to 1000 µm, the conductor wafer is ground to be typically about 100 µm to 600 µm, and sometimes, to be about 50 µm, depending on the type of the semiconductor chip. The thickness of the semiconductor wafer before being ground is suitably determined according to the diameter, the type, or the like of the semiconductor wafer, and the thickness of the semiconductor wafer after being ground is suitably determined according to the obtained chip size, the type of the circuit, or the like.

The method of grinding process of a semiconductor wafer back surface is not particularly limited, and a known grinding method such as a through-feed method, an in-feed method, or the like is adopted. When grinding, it is preferable to perform grinding while cooling the semiconductor wafer and the grindstone by spraying water. Examples of the grinding machine grinding a wafer back surface include model: DFG-860, manufactured by Disco Corporation, Ltd., model: SVG-502MKII8, manufactured by Okamoto Machine Tool Works Ltd., and model: Polish grinder PG200, manufactured by Tokyo Seimitsu Co., Ltd.

Next, as shown in FIG. 2(d), the principal surface of the thinned semiconductor wafer 101 is attached to the semiconductor wafer protective film 10 through the adhesive layer 3 of the semiconductor wafer protective film 10. As the attaching conditions, the temperature is preferably 20° C. to 80° C., and more preferably 20° C. to 60° C., and the pressure is preferably 0.3 MPa to 0.5 MPa, and more preferably 0.35 MPa to 0.45 MPa.

The attaching operation of the semiconductor wafer protective film 10 is performed by hand in some cases, however, in general, the attaching operation is performed by an apparatus called an automatic sticking machine with a roll type adhesive film. Examples of this type of automatic sticking machine include model: DTM-812W and ATM-12000DR, manufactured by Takatori Corporation, model: DFM2700 and DFM2800, manufactured by Disco Corporation, Ltd., model: MA-3000, manufactured by Nitto Seiki Co., Ltd., and model: RAD-2500, manufactured by Lintec Corporation.

For wafer support after support substrate removal, a form in which the semiconductor wafer protective film 10 is attached to a wafer together with a frame-shape jig called a ring frame which is disposed around the wafer may be adopted. The semiconductor wafer protective film 10 typically has a roll shape, however, a form in which sheets die-cut in the same shape as that of the ring frame are wound may be adopted. This is typically referred to as a pre-cut roll.

The temperature when the semiconductor wafer protective film 10 is attached is preferably 20° C. to 80° C., and more preferably 20° C. to 60° C. In a case where the automatic sticking machine described above is equipped with a unit which raises the temperature of the semiconductor wafer 101 prior to a step of attaching the semiconductor wafer protective film 10, the adhesive film may be attached in a state of raising the temperature of the semiconductor wafer 101 to a suitable temperature by a heating unit.

Next, after the adhesive layer 103 is dissolved by using a solvent, as shown in FIG. 2(e), the support substrate 102 is peeled from the semiconductor wafer 101. At this time, the adhesive layer 103 on the semiconductor wafer 101 is washed with and removed by a solvent.

As the solvent, solvents known in the related art are used, and examples thereof include organic solvents such as terpene, limonene, N-methyl-2-pyrrolidone (NMP), mesitylene, toluene, xylene, cyclohexane, hexane, and methyl ethyl ketone. In addition to the above solvents, for final washing of the semiconductor wafer 101, other solvents such as acetone, methyl ethyl ketone, IPA, ethanol, or methanol, or water may be used.

Figure 3:
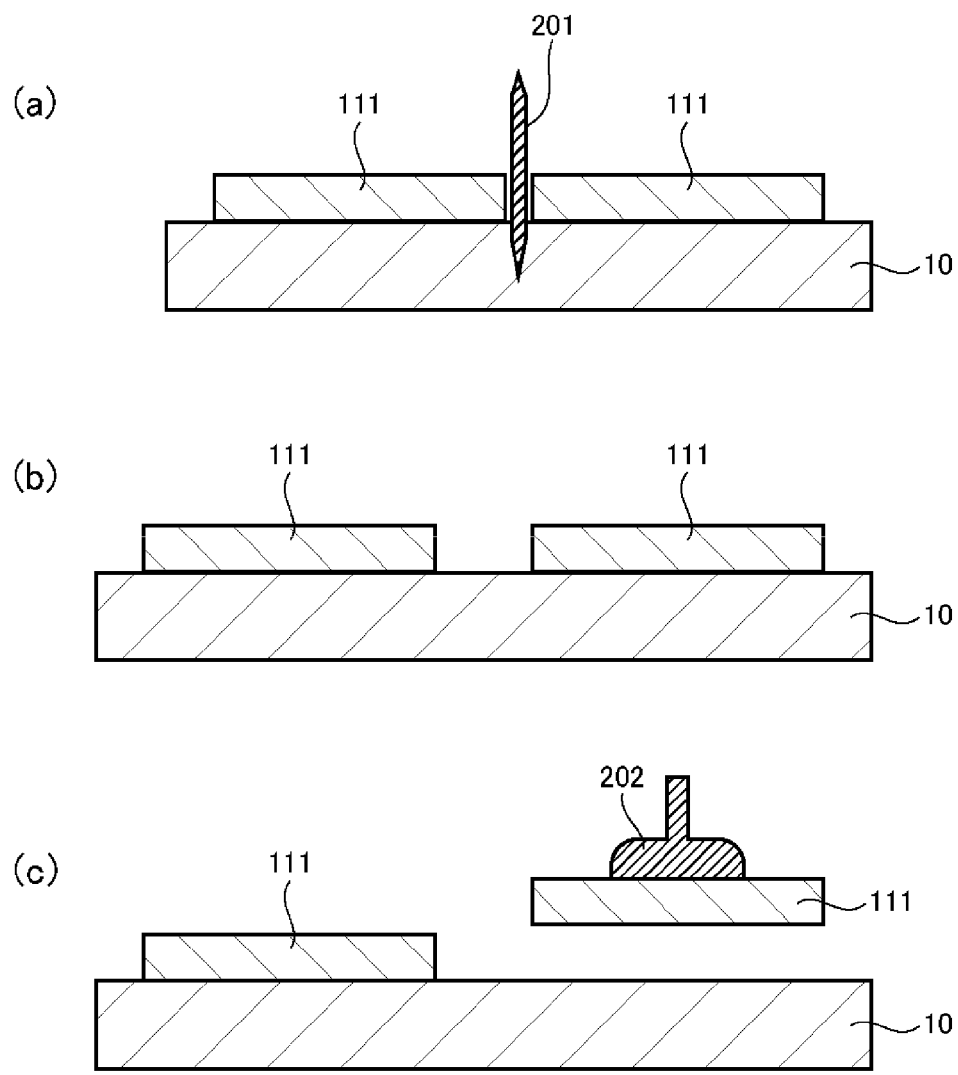
FIG. 3 is a process sectional view schematically showing one example of a method of manufacturing a semiconductor device according to the embodiment.

Thereafter, as shown in FIG. 3(a), the semiconductor chip 111 is obtained by dicing the semiconductor wafer 101 together with the semiconductor wafer protective film 10 using a dicing blade 201.

The method of dicing the semiconductor wafer 101 is not particularly limited, and dicing methods known in the related art, such as a blade method, a laser ablation method, a stealth laser method may be used. Examples of the dicing apparatus include model: DFD6362, DFL7160, and DFL7360, manufactured by Disco Corporation, Ltd. and model: AD3000T/S and ML300, manufactured by Tokyo Seimitsu Co., Ltd. In addition, a form in which dicing is performed before attachment of the semiconductor wafer protective film 10, then, the semiconductor wafer protective film 10 is attached, and the support substrate 102 and the adhesive layer 103 are removed may be adopted.

Next, as shown in FIG. 3(b), the semiconductor wafer protective film 10 is expanded in the horizontal direction, and using a pick-up tool 202, the semiconductor chip 111 is picked up from the semiconductor wafer protective film 10. The method of picking up the semiconductor chip 111 is not particularly limited, and pick-up methods known in the related art may be used. Examples of the pick-up apparatus include model: FCB3, manufactured by Panasonic Factory Solutions Co., Ltd., model: TFC-6000, manufactured by Shibaura Mechatronics Corporation, and model: FC3000, manufactured by Toray Engineering Co., Ltd. In a case where the semiconductor wafer protective film 10 is formed of a polymer crosslinked by energy rays, energy rays are applied before pick-up to proceed a crosslinking reaction in the adhesive, and thus, it is possible to easily perform the pick-up.

Using the obtained semiconductor chip ill, a semiconductor device is manufactured.

As described above, although the embodiments of the present invention have been set forth with reference to the drawings, these are merely illustrative of the present invention, and various configurations other than those stated above may be adopted.

EXAMPLES

For each item in Examples and Comparative Examples, measurement and evaluation were performed according to the following measurement method and evaluation method, and the results are shown in Table 1.

(Measurement Method)

Elastic Modulus (1) Tensile Modulus Ea (GPa)

A substrate film was cut out into 25 mm×150 mm, and tensile modulus was measured within a temperature range of 25° C. to 100° C. at a frequency of 1 Hz using RSA3 manufactured by TA Instruments.

(2) Storage Modulus Gb, Gc (MPa)

A coating liquid was applied on a release-treated surface side of a PET film (release film) in which a silicone treatment was performed on one surface and dried, under the same coating conditions (thickness, drying temperature, drying time, and the like) as those when producing each adhesive layer or absorbing layer of Examples and Comparative Examples, whereby an adhesive layer or an absorbing layer was formed on the release-treated surface of the PET film. After the adhesive layer or the absorbing layer was formed, in order to apply the same thermal history as that of each adhesive layer or absorbing layer described in Examples and Comparative Examples, the adhesive layer or the absorbing layer in a state of a single layer was heated at 60° C. for 48 hours. The obtained layers were sequentially superposed to form a film shape sheet of the adhesive layer or the absorbing layer having a thickness of about 1 mm. From the film shape sheet, a disk shape sample having a diameter of about 8 mm and a thickness of about 1 mm was collected. The storage modulus of this sample was measured within a temperature range of 25° C. to 100° C. at a frequency of 1 Hz using a dynamic viscoelasticity measurement apparatus [manufactured by Rheometric Scientific Inc., model; RMS-800, a parallel plate (parallel disk) type attachment having a diameter of 8 mm was used]. Specifically, the sample was set in the dynamic viscoelasticity measurement apparatus through the parallel plate type attachment at 25° C., the storage modulus was measured while heating from 25° C. to 100° C. at a temperature raising rate of 3° C./min. After the measurement, in the obtained storage modulus-temperature curve at 25° C. to 100° C., the minimum value (G'min, MPa) of the storage modulus (G', MPa) at 50° C. to 100° C., the storage modulus (G', MPa) at 60° C., or the storage modulus (G'25° C., MPa) at 25° C. was adopted, as necessary.

Gel Fraction

The gel fraction was determined as follows. About 1 g (W1) of an adhesive layer or an absorbing layer was immersed in 100 g of a mixed solution (1:1) of toluene and ethyl acetate at 25° C. for 168 hours, filtration was performed, the filtrate was dried, the weight (W2) was determined, and the gel fraction was calculated by the following formula (1).

$$\{(w1/w2)/W1\}\times 100(\%) \quad (1)$$

(Evaluation Method)

Solvent Resistance 1 (There was No Unevenness on the Wafer Attaching Surface)

First, an 8-inch wafer having a mirror-like surface and a ring frame were prepared. Next, the produced film was attached to the back surface of the wafer and the ring frame, and from the surface of the wafer and the ring frame, a solvent was added dropwise so as to spread throughout the film. After the dropwise addition, the solvent was removed after 30 minutes, the change in appearance of the film before and after the solvent was added dropwise, and permeation of the solvent between the wafer and the film were examined.

○: Appearance of the film was not changed, and permeation of the solvent did not occur ×: Appearance of the film was significantly changed, and permeation of the solvent occurred Solvent Resistance 2 (there was Unevenness on the Wafer attaching surface)

First, an 8-inch wafer in which solder bumps having a height of 80 μm and a pitch of 200 μm were disposed on the surface and a ring frame were prepared. Next, the produced film was attached to the back surface of the wafer and the ring frame, and from the surface of the wafer and the ring frame, a solvent was added dropwise so as to spread throughout the film. After the dropwise addition, the solvent was removed after 30 minutes, the change in appearance of the film before and after the solvent was added dropwise, and permeation of the solvent between the wafer and the film were examined.

○: Appearance of the film was not changed, and permeation of the solvent did not occur ×: Appearance of the film was significantly changed, and permeation of the solvent occurred Expansibility As shown in FIG. 4(a), the adhesive layer side of a produce film 40 was adhered to an SUS ring frame 44 for a 6 inch wafer by a rubber roll.

Marks a, b, A, B, a', b', A', and B' as shown in FIG. 4(a) were written on the surface of the film 40. The lengths of a-a', b-b', A-A', and B-B' before expansion were '60 mm, 60 mm, 120 mm, and 120 mm, respectively.

Figure 4:
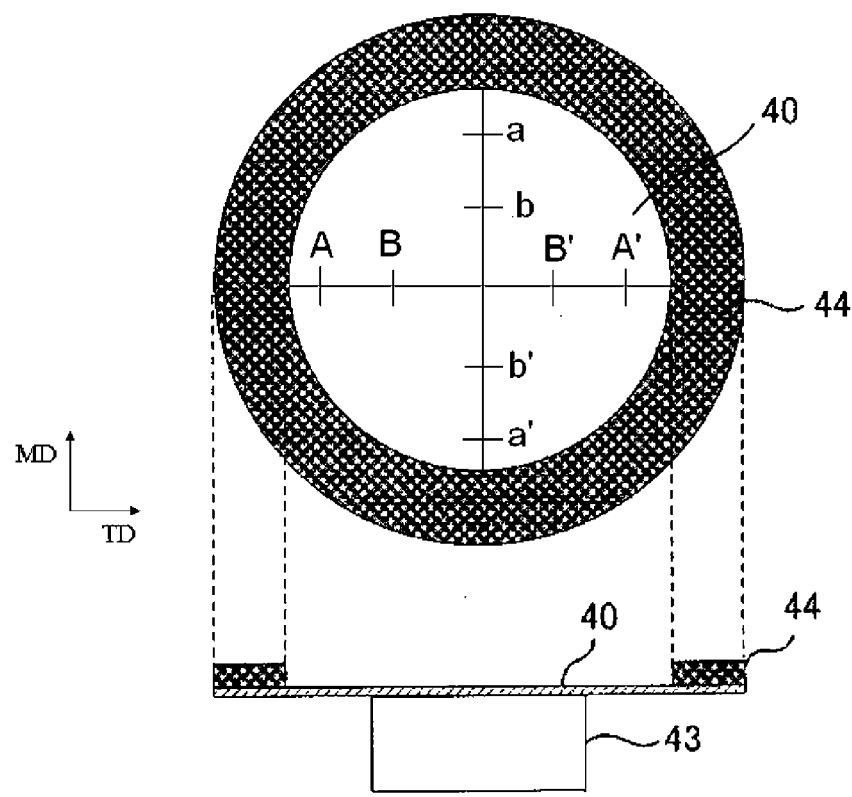
FIG. 4 is (a) a plan view schematically showing a test method of the semiconductor wafer protective film of the present invention, and (b) a sectional view thereof.
Figure 5:
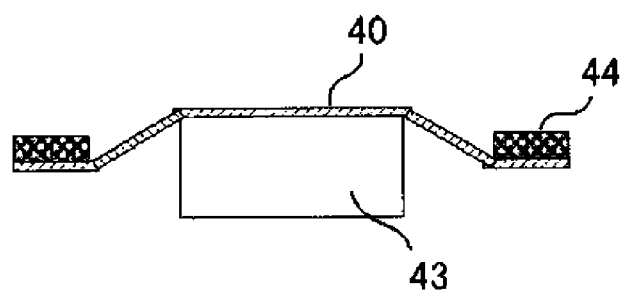
FIG. 5 is a sectional view schematically showing the test method of the semiconductor wafer protective film of the present invention.

Next, as shown in FIG. 4 (b), the ring frame 44 was fixed to an expander such that the substrate layer surface of the film 40 was come into contact with a stage 43 of the expander. As shown in FIG. 5, the film 40 was expanded by raising the stage 43 of the expander at a pulling speed of 5 mm/min and a pulling amount of 10 mm, and the lengths of a-a', b-b', A-A', and B-B' were measured, respectively.

As the expander, HS-1800 manufactured by Bugle Electronics Inc. was used.

The proportion of the length after expansion to the length before expansion of a-a', b-b', A-A', or B-B' was defined as an expansion ratio (%).

○: Equal to or greater than 1%

×: Less than 1%, or tape peeling occurred from a ring frame

EXAMPLE 1

Production of Absorbing Layer-Adhesive Main Agent

A monomer mixture of 30 parts by weight of ethyl acrylate, 40 parts by weight of 2-ethylhexyl acrylate, 10 parts by weight of methyl acrylate, and 20 parts by weight of glycidyl methacrylate was allowed to react at 80° C. for 10 hours in a mixture of 65 parts by weight of toluene and 50 parts by weight of ethyl acetate using 0.8 parts by weight (0.32 part by weight as an initiator) of a benzoyl peroxide-based polymerization initiator [manufactured by NOF Corporation, Nyper BMT-K40]. After the reaction ended, to this, 100 parts by weight of xylene, 10 parts by weight of acrylic acid, and 0.3 parts by weight of tetradecyl dimethyl benzyl ammonium chloride [manufactured by NOF Corporation, Cation M2-100] were added, and the resultant product was allowed to react at 85° C. for 50 hours while blowing air thereinto, whereby a solution (absorbing layer-adhesive main agent) of an acryl-based adhesive polymer was obtained.

Preparation of Coating Liquid for Absorbing Layer 0.02 parts by weight of an isocyanate-based crosslinking agent [manufactured by Mitsui Toatsu Chemicals, Inc., Olester P49-75-S] was added to the obtained absorbing layer-adhesive main agent as a thermal crosslinking agent, whereby a coating liquid for an absorbing layer was obtained.

Preparation of Coating Liquid for Adhesive 2 parts by weight of benzyl dimethyl ketal [manufactured by Ciba-Geigy Japan Limited, Irgacure 651] as an intramolecular bond cleavage type photopolymerization initiator and 0.3 part by weight of a mixture [manufactured by Toagosei Chemical Industry Co., Ltd., Aronix M-400] of dipentaerythritol hexaacrylate and dipentaerythritol monohydroxy pentaacrylate as a monomer having a polymerizable carbon-carbon double bond in the molecule, with respect to 100 parts by weight of acryl-based adhesive polymer solid content, were added to the obtained adhesive main agent, and 1.35 parts by weight (1 part by weight as a thermal crosslinking agent) of an isocyanate-based cross-linking agent [manufactured by Mitsui Toatsu Chemicals, Inc., Olester P49-75-S] as a thermal crosslinking agent was further added thereto, whereby a coating liquid for an adhesive was obtained.

Production of Absorbing Layer-Attached Substrate Film

The above coating liquid for an absorbing layer was applied to the release-treated surface of a polyethylene terephthalate film (release film, thickness: 40 μm) which was subjected to a silicone release treatment using a lip coater, and the resultant product was dried at 120° C. for 2 minutes, whereby an absorbing layer having a thickness of 100 μm was provided thereon. Thereafter, the absorbing layer was transferred by binding and pressing a corona-treated surface of the polyethylene terephthalate film shown in Table 1, prepared as a substrate film, whereby an absorbing layer-attached substrate film is produced.

Production of Semiconductor Wafer Protective Film

The coating liquid for an adhesive layer obtained above was applied to the release-treated surface of a polyethylene terephthalate film (release film, thickness: 40 μm) which was subjected to a silicone release treatment using a lip coater in the same manner, and the resultant product was dried at 120° C. for 2 minutes, whereby an adhesive layer having a thickness of 10 μm was provided thereon. Thereafter, the adhesive layer and the absorbing layer side of the absorbing layer-attached substrate film obtained above were bound, the resultant product was heated at 60° C. for 24 hours, and cooled to room temperature, whereby a semiconductor wafer protective adhesive film was produced.

EXAMPLE 2

A semiconductor wafer protective film was produced in the same manner as in Example 1 except that a substrate film was produced in the following manner.

Production of Substrate Film

Polybutylene terephthalate containing polytetramethylene glycol of 20% was formed into a polybutylene terephthalate film having a thickness of 50 μm using a T-die extruder. At this time, a corona treatment was performed on the surface of the side on which where the absorbing layer was bound. The variation in thickness of the obtained polybutylene terephthalate film was within ±1.5%.

EXAMPLE 3

The coating liquid for an adhesive obtained in Example 1 was applied to the release-treated surface of a polyethylene terephthalate film (release film, thickness: 40 μm) which was subjected to a silicone release treatment using a lip coater, and the resultant product was dried at 120° C. for 2 minutes, whereby an adhesive layer having a thickness of 10 μm was provided thereon. Thereafter, the corona-treated surface of the polyethylene terephthalate film shown in Table 1, prepared as a substrate film, was bound and pressed, whereby a semiconductor wafer protective film was produced.

EXAMPLE 4

The coating liquid for an adhesive obtained in Example 1 was applied to the release-treated surface of a polyethylene terephthalate film (release film, thickness: 40 μm) which was subjected to a silicone release treatment using a lip coater, and the resultant product was dried at 120° C. for 2 minutes, whereby an adhesive layer having a thickness of 10 μm was provided thereon. Thereafter, the corona-treated surface of the substrate film produced in Example 2 was bound and pressed, whereby a semiconductor wafer protective film was produced.

Comparative Example 1

A semiconductor wafer protective film was produced in the same manner as in Example 1 except that the substrate film shown in Table 1 was used as the substrate film used in Example 1.

Comparative Example 2

A semiconductor wafer protective film was produced in the same manner as in Example 3 except that the substrate film shown in Table 1 was used as the substrate film used in Example 3.

TABLE 1

| | | | Example 1 | Example 2 | Example 3 | Example 4 | Comparative Example 1 | Comparative Example 1 |
|---|---|---|---|---|---|---|---|---|
| Film configuration | Substrate layer | Material | PET | PBT•PTMG copolymer | PET | PBT•PTMG copolymer | EVA | EVA |
| | | Method to obtain (manufacturer, name) | Commercially available product | OG film PBT super soft type BS-50 | Commercially available product | OG film PBT super soft type BS-50 | Du Pont-Mitsui EV460 | Du Pont-Mitsui EV460 |
| | | SP value of base polymer | 9.8 | Equal to or greater than 9.0 (PBT 9.4 PTMG 8.8) | 9.8 | Equal to or greater than 9.0 (PBT 9.4 PTMG 8.8) | 8.6 | 8.6 |
| | | SP value of copolymer simple substance | — | 8.8 | — | 8.8 | — | — |
| | | Melting point of copolymer simple substance (° C.) | — | 20 | — | — | — | — |
| | | tensile modulus Ea at 25° C. and a frequency of 1 Hz | 3.5 GPa | 0.19 GPa | 3.5 GPa | 0.19 GPa | 0.07 GPa | 0.07 GPa |
| | | Thickness (μm) | 50 μm | 50 μm | 50 μm | 50 μm | 120 μm | 120 μm |
| | Absorbing layer | Material | Acryl | Acryl | Not present | Not present | Acryl | Not present |
| | | Thickness (μm) | 100 μm | 100 μm | — | — | 100 μm | — |
| | | Gel fraction (%) | 76 | 76 | — | — | 76 | — |
| | | Storage modulus Gb at 25° C. and a frequency of 1 Hz | 6E+05 Pa | 6E+05 Pa | — | — | 6E+05 Pa | — |
| | | Storage modulus Gb at 60° C. and a frequency of 1 Hz | 8E+04 Pa | 8E+04 Pa | — | — | 8E+04 Pa | — |
| | Adhesive layer | Material | Acryl | Acryl | Acryl | Acryl | Acryl | Acryl |
| | | Thickness (μm) | 10 μm | 10 μm | 10 μm | 10 μm | 10 μm | 10 μm |
| | | Gel fraction (%) | Equal to or greater than 60 (%) | Equal to or greater than 60 (%) | Equal to or greater than 60 (%) | Equal to or greater than 60 (%) | Equal to or greater than 60 (%) | Equal to or greater than 60 (%) |
| | | Storage modulus Gc at 25° C. and a frequency of 1 Hz | 6E+05 Pa | 6E+05 Pa | 6E+05 Pa | 6E+05 Pa | 6E+05 Pa | 6E+05 Pa |
| Evaluation result | Solvent resistance 1 | | ○ | ○ | ○ | ○ | x | x |
| | Expansibility | | x | ○ | x | ○ | ○ | ○ |
| | Solvent resistance 2 | | ○ | ○ | x | x | x | x |

This application claims priority from Japanese Patent Application No. 2013-113448 filed on May 29, 2013, the content of which is incorporated herein by reference in its entirety.

The invention claimed is:

1. A semiconductor wafer protective film, comprising:
a substrate layer (A); and
an adhesive layer (C) formed on the substrate layer (A),
wherein the substrate layer (A) includes a polymer that includes an expansibility imparting component as a copolymer component, and the melting point of the expansibility imparting component simple substance is equal to or lower than 40° C., and a solubility parameter of the polymer determined by a Van Krevelen method is equal to or greater than 9.

2. The semiconductor wafer protective film according to claim 1,
wherein the expansibility imparting component includes glycol.

3. The semiconductor wafer protective film according to claim 1, further comprising:
an absorbing layer (B) between the substrate layer (A) and the adhesive layer (C),
wherein the absorbing layer (B) includes an acryl-based polymer, and the gel fraction is 30% by weight to 90% by weight.

4. The semiconductor wafer protective film according to claim 3,
wherein a storage modulus Gb of the absorbing layer (B) at 25° C. and at a frequency of 1 Hz is equal to or greater than 0.01 MPa and equal to or less than 1 MPa.

5. The semiconductor wafer protective film according to claim 3,
wherein the substrate layer (A) and the absorbing layer (B) are at least partially in contact with each other.

6. The semiconductor wafer protective film according to claim 1
wherein the adhesive layer (C) includes an acryl-based polymer, and the gel fraction is 30% by weight to 90% by weight.

7. The semiconductor wafer protective film according to claim 1, wherein the storage modulus Gc of the adhesive layer (C) at 25° C. and at a frequency of 1 Hz is equal to or greater than 0.01 MPa and equal to or less than 10 MPa.

8. The semiconductor wafer protective film according to claim 1,
wherein the substrate layer (A) is configured of only a polymer in which the solubility parameter is equal to or greater than 9.

9. A method of manufacturing a semiconductor device, comprising:
a first step of attaching a semiconductor wafer to the semiconductor wafer protective film according to claim 1 through the adhesive layer (C); and
a second step of washing the semiconductor wafer together with the semiconductor wafer protective film with a solvent.

10. The method of manufacturing a semiconductor device according to claim 9,
wherein a difference in level of 5 μm to 200 μm is provided on the surface of the semiconductor wafer of the side to which the semiconductor wafer protective film is attached.

11. The method of manufacturing a semiconductor device according to claim 9, further comprising:
a third step of obtaining semiconductor chips by dicing the semiconductor wafer together with the semiconductor wafer protective film, after the second step; and
a fourth step of expanding the semiconductor wafer protective film in the horizontal direction and of picking up the semiconductor chips from the semiconductor wafer protective film.

12. The method of manufacturing a semiconductor device according to claim 9,
wherein the semiconductor wafer protective film is attached to the surface of the semiconductor wafer at a temperature of 20° C. to 80° C. and at a pressure of 0.3 MPa to 0.5 MPa in the first step.

13. The semiconductor wafer protective film according to claim 1,
wherein the expansibility imparting component includes polytetramethylene glycol.

* * * * *